July 9, 1963 A. SIEMENS 3,097,329

SINTERED PLATE WITH GRADED CONCENTRATION OF METAL TO ACCOMMODATE ADJACENT METALS HAVING UNEQUAL EXPANSION COEFFICIENTS

Filed June 16, 1961

United States Patent Office 3,097,329

Patented July 9, 1963

3,097,329

›INTERED PLATE WITH GRADED CONCENTRATION OF METAL TO ACCOMMODATE ADJACENT METALS HAVING UNEQUAL EXPANSION COEFFICIENTS

ılfred Siemens, Erlangen, Germany, assignor to Siemens-Schuckertwerke Aktiengesellschaft, Berlin-Siemensstadt, Germany, a corporation of Germany Filed June 16, 1961, Ser. No. 117,617
Claims priority, application Germany June 21, 1960
4 Claims. (Cl. 317—234)

My invention relates to rectifiers, transistors and other lectronic semiconductor devices particularly those that re subjected to elevated and varying temperatures when ı use.

The contacted areas of the crystalline semiconductor odies in such devices, especially when large-area en- ıgements are involved, encounter trouble in the event f thermal alternating stresses, due to the different ther- ıal coefficients of expansion of the respectively different ıaterials adjacent and bonded to each other. Such prob- ms occur particularly with semiconductor devices for ectric power circuits, for example power transistors and ›wer rectifiers. Thus, silicon has a coefficient of ex- ınsion greatly different from those of the contacting etals such as tungsten or molybdenum, and also from .e coefficients of expansion of such carrier metals as ›pper or silver, as well as those of metals which, like ›n and brass, are often used for the housing of such de- ces. As a result, thermal alternating stresses may cause ımage or destruction of a semiconductor device com- ›sed of these different substances.

Various proposals have become known for eliminating e above-mentioned difficulties. According to one of ese, silicon rectifiers are provided with carrier plates ıich consist of a sintered structure of tungsten, molyb- num or chromium, filled with a good conducting metal. ıis affords a relatively good adaptation to the thermal pansion coefficient of the semiconductor body, but not the junction of the carrier plate or housing if the latter nsists of copper or silver, for example.

It is an object of my invention, relating to an electronic niconductor device, particularly of the type subjected thermal alternating stresses, to greatly minimize or minate the above-mentioned difficulties.

To this end, and in accordance with a feature of my ʼention, I provide between the semiconductor body and ː adjacent metal body, such as a carrier plate or struc- ·e, an intermediate sintered plate whose composition ıtinuously varies in a given sense from the contact ·face adjacent to the semiconductor body toward the ıtact surface adjacent to the carrier or other metal ·mber.

According to a more specific feature of my invention, intermediate sintered plate consists completely of a ıtact metal at its surface facing the semiconductor ly and consists entirely of the carrier metal or a metal substantially the same thermal coefficient of expan- n on the side facing the carrier structure, whereas in intermediate region of the sintered plate the propor- ı of the latter metal increases, preferably at a steady ›, in the direction from the semiconductor toward the rier.

The invention is particularly advantageous in conjunc- ı with silicon rectifiers. In this case, the side of the ·rmediate plate facing the silicon body consists, for mple, of molybdenum or tungsten to which a slight ount of nickel may be added, and the plate side facing carrier structure consists of copper or silver. In the intermediate range, the copper or silver proportion steadily increases from the latter side toward the side facing the silicon body. The above-mentioned addition of nickel to the contacting metal, such as molybdenum or tungsten, is preferably given an amount of 0.1 to 5% by weight.

For further explaining the invention reference will be made to the accompanying drawing in which.

Figure 1:
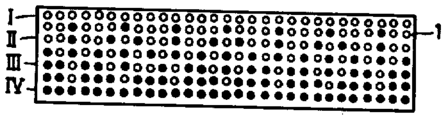
FIG. 1 shows a cross-section of an intermediate sintered plate according to the invention symbolically indicating the change in ratio of contact-metal to carrier-metal along the height of the plate.
Figure 2:
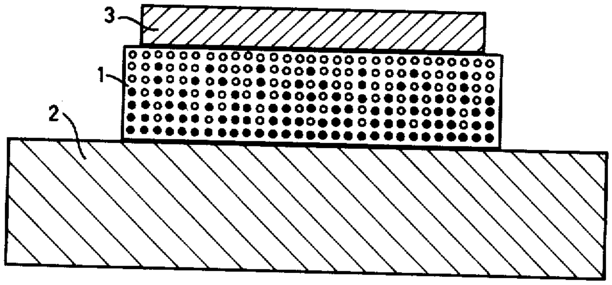
FIG. 2 shows in a similar manner the face-to-face connection of the same sintered intermediate plate with a semiconductor body and a carrier plate.

The sintered plate 1 according to FIG. 1 is schematically shown to have four horizontal regions I, II, III, IV. The region I faces the semiconductor body 3 according to FIG. 2. This region consists of the contacting metal, preferably molybdenum or tungsten. The region IV, facing the carrier structure 2 consists of the same metal as the carrier, preferably of copper or silver, or an alloy thereof. However, the region IV may also consist of another metal having substantially the same thermal coefficient of expansion as the metal of the carrier 2. The intermediate ranges II and III contain a continuously increasing proportion of the region-IV metal. For a silicon rectifier, as described below with reference to FIG. 3, the following compositions of the respective regions are applicable:

*Example No. 1*

| | | Parts by weight |
|---|---|---|
| I. | Molybdenum/nickel | 99 to 1 |
| II. | Molybdenum/copper | 80 to 20 |
| III. | Molybdenum/copper | 50 to 50 |
| IV. | Copper | 100 |

*Example No. 2*

| | | |
|---|---|---|
| I. | Tungsten/nickel | 95/5 |
| II. | Tungsten/copper | 80/20 |
| II. | Tungsten/copper | 50/50 |
| IV. | Copper | 100 |

*Example No. 3*

| | | |
|---|---|---|
| I. | Tungsten/nickel | 98/2 |
| II. | Tungsten/silver/nickel | 80/18/2 |
| III. | Tungsten/silver | 50/50 |
| IV. | Silver | 100 |

A sintered plate for the purposes of invention can be produced by conventional powder metallurgical method. Accordingly, a mold is filled with a continuously changing powder composition corresponding to the schematic representation in FIG. 1. The powder in the mold is thereafter pre-pressed, and the body thus shaped is subsequently sintered. The pressing and sintering conditions are so chosen that the resulting degree of porosity corresponds to the particular requirements. Thus, the following fabricating data are applicable to the examples of compositions described above.

For producing a graduated sintered plate according to Example 1, the powder was compressed at a pressure of 7 tons (metric) per cm.$^2$, resulting in a density of 7.8 g./cm.$^3$ of the pressed body. Sintering was effected at 1060° C. for 1 hour in hydrogen. This resulted in a final density of 9.0 g./cm.$^3$ corresponding to a space filling degree of 0.95 and hence to a porosity degree of 0.05.

The corresponding data for Examples 2 and 3 are as follows:

| | Example 2 | Example 3 |
|---|---|---|
| Molding pressure, t./cm.² | 3 | 2.5 |
| Molding density, g./cm.³ | 10.3 | 10.7 |
| Sintering temperature, ° C. | 1,060 | 940 |
| Final porosity | 0.21 | 0.24 |

In Example 2, the following powder quantities were used for producing a porous sinter plate of 25 mm. diameter:

Layer I: 8 g. W/Ni powder in the ratio 95/5
Layer II: 3 g. W/Cu powder in the ratio 80/20
Layer III: 3 g. W/Cu powder in the ratio 50/50
Layer IV: 3 g. pure Cu The intermediate plate in a semiconductor device according to the invention is capable of bridging or buffering the unequal thermal expansion of the semiconductor body 3 and the carrier 2, thus preventing the occurrence of critical mechanical tension in the semiconductor device. In addition, an intermediate plate according to the invention has an improved electrical and thermal conductance in comparison with the above-mentioned known sintered carrier plates consisting of a sintered structure of tungsten, molybdenum or chromium with a filler of conducting metal. As a result, the heat dissipation from the semiconductor device according to the invention is improved and a lower temperature of equilibrium attained.

Figure 3:
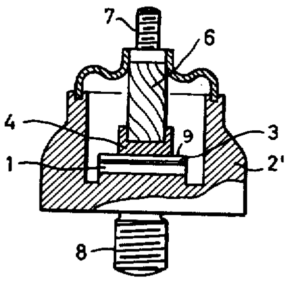
FIG. 3 shows, in section, a silicon power rectifier according to the invention.

In the silicon power rectifier shown in FIG. 3, the carrier structure 2' of copper or silver forms part of a housing. The sintered intermediate plate 1 is in face-to-face contact with a planar surface of the housing 2' and is joined therewith, for example, by soft soldering. Placed on top of the sintered intermediate plate 1 is a wafer 3 of silicon. Bonded to the top side of the silicon wafer is a contact carrier plate 9 consisting for example of molybdenum. Attached to the top of contact plate 9 is a terminal 4 of copper which is joined with a flexible, stranded conductor 6 to whose other end a terminal in form of a screw bolt 7 is secured. Another screw bolt 8 is integral with the housing 2'.

I claim:

1. An electronic semiconductor device subject to thermal alternating stresses when in use, comprising a crystalline semiconductor body, a carrier structure of good conducting metal, and an intermediate plate having respective surfaces bonded to said semiconductor body and to said carrier structure respectively in face-to-face area contact with both, said intermediate plate consisting at its semiconductor side of a contact metal having a higher melting point than said carrier metal, and said plate consisting at its carrier side of another metal having the same thermal coefficient of expansion as said carrier metal, the intermediate region of said plate having a proportion of said contact metal increasing from said carrier side towards said semiconductor side.

2. In an electronic semiconductor device according to claim 1, said other metal in said intermediate plate being the same as said carrier metal, and said proportion of contact metal increasing at a constant rate from said carrier side to said semiconductor side of said plate.

3. An electronic semiconductor device subject to thermal alternating stresses when in use, comprising a crystalline semiconductor body of silicon, a carrier structure of good conducting metal selected from the group consisting of copper and silver, and an intermediate plate having respective surfaces bonded to said semiconductor body and to said carrier structure respectively in face-to-face area contact with both, said intermediate plate consisting at its semiconductor side of metal selected from the group consisting of molybdenum and tungsten, and said plate consisting at its carrier side of said carrier metal, the intermediate region of said plate having a proportion of said contact metal increasing from said carrier side toward said semiconductor side.

4. In an electronic semiconductor device according to claim 3, said contact metal comprising an addition of about 0.1% to about 5% by weight.

References Cited in the file of this patent

UNITED STATES PATENTS

| | | |
|---|---|---|
| 2,317,786 | Lubbe | Apr. 27, 1943 |
| 2,362,353 | Cate | Nov. 7, 1944 |
| 2,946,935 | Finn | July 26, 1960 |